United States Patent
Barabi et al.

(10) Patent No.: US 11,293,976 B1
(45) Date of Patent: Apr. 5, 2022

(54) INTEGRATED CIRCUIT DEVICE TEST TOOLING WITH DUAL ANGLE CAVITIES

(71) Applicant: ESSAI, INC., Fremont, CA (US)

(72) Inventors: Nasser Barabi, Lafayette, CA (US); Oksana Kryachek, San Francisco, CA (US); Joven R. Tienzo, Fremont, CA (US); Chee Wah Ho, Fremont, CA (US)

(73) Assignee: ESSAI, INC., Fremont, CA (US)

( * ) Notice: Subject to any disclaimer, the term of this patent is extended or adjusted under 35 U.S.C. 154(b) by 0 days.

(21) Appl. No.: 17/090,830

(22) Filed: Nov. 5, 2020

Related U.S. Application Data

(60) Provisional application No. 63/083,575, filed on Sep. 25, 2020.

(51) Int. Cl.
  *G01R 1/067* (2006.01)
  *G01R 31/28* (2006.01)
  *G01R 1/073* (2006.01)

(52) U.S. Cl.
  CPC ..... *G01R 31/2891* (2013.01); *G01R 1/06722* (2013.01); *G01R 1/07342* (2013.01)

(58) Field of Classification Search
  CPC ............ G01R 31/2891; G01R 1/07342; G01R 1/06722
  See application file for complete search history.

(56) References Cited

U.S. PATENT DOCUMENTS

| | | | |
|---|---|---|---|
| 6,447,328 B1 * | 9/2002 | Feldman | G01R 1/07314 439/482 |
| 6,459,039 B1 * | 10/2002 | Bezama | H01L 23/49827 174/359 |
| 10,481,175 B2 | 11/2019 | Barabi et al. | |

FOREIGN PATENT DOCUMENTS

| WO | WO 2018/021140 | 2/2018 |
|---|---|---|
| WO | WO 2019/187957 | 10/2019 |

\* cited by examiner

*Primary Examiner* — Lee E Rodak
(74) *Attorney, Agent, or Firm* — Kang S. Lim

(57) ABSTRACT

A test probe assembly for testing packaged integrated circuit (IC) devices includes a plurality of probes, a pad and a PCB/interposer. The plurality of probes is configured to repeatedly maintain reliable electrical contact, for example, reliable grounding, with a corresponding plurality of DUT contacts when under a compliant force. Reliability and/or grounding can be accomplished by introducing a small angular differential between the bore axis of the upper block and the bore axis of the main block.

7 Claims, 11 Drawing Sheets

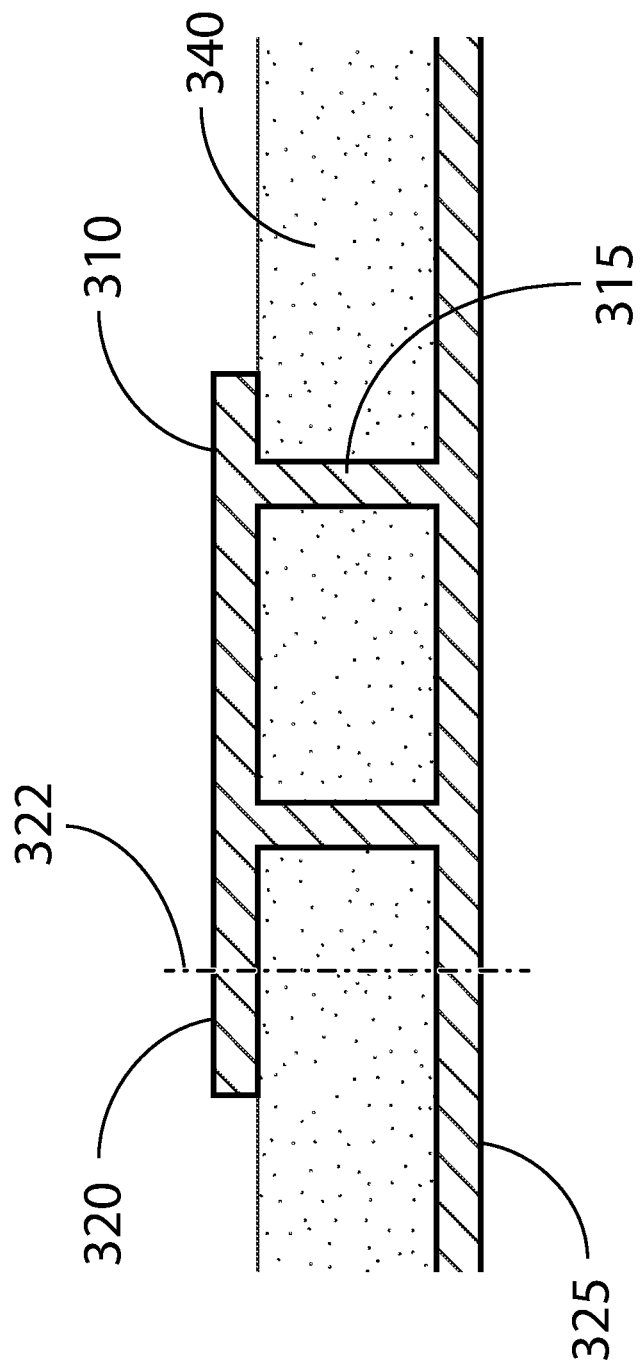
FIG. 3B  *PRIOR ART*

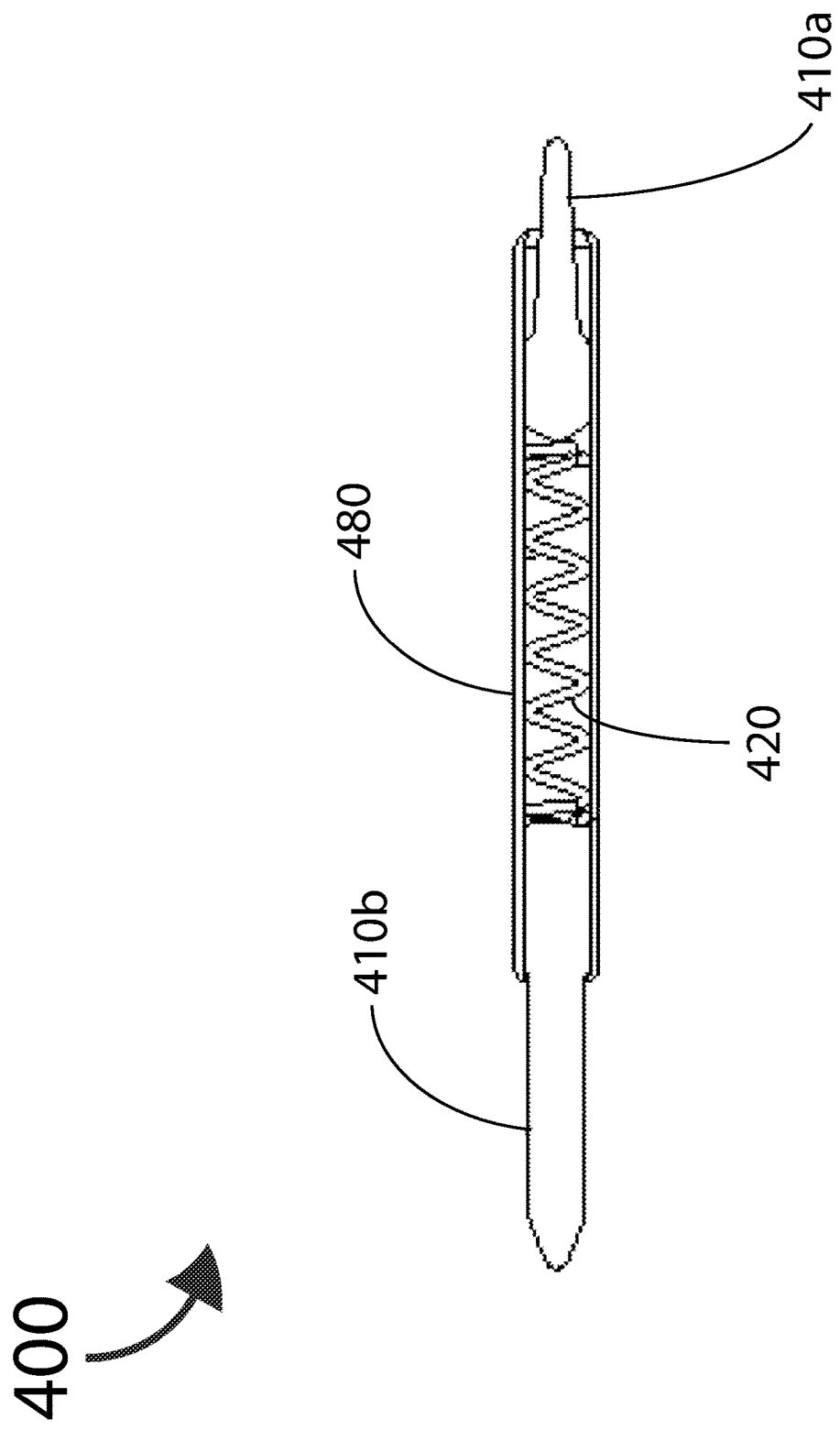

INTEGRATED CIRCUIT DEVICE TEST TOOLING WITH DUAL ANGLE CAVITIES

CROSS-REFERENCE TO RELATED APPLICATION

This application claims the benefit and priority of U.S. Provisional Application No. 63/083,575, filed Sep. 25, 2020, which is incorporated herein in its entirety by this reference.

BACKGROUND

The present invention relates to systems and methods for reliable test tooling for packaged integrated circuits (IC) devices. In particular, improved grounding probe structures for IC device test tooling are provided Current test socketing solutions for packaged IC devices have been subject to deviation and inconsistency in penetration capability of the contact point and hence electrical continuity due to life cycle wear and tear stresses. These unavoidable effects have continued to instigate invalid test failures, higher retest rates, higher test-tooling down-time and resulting higher IC device test costs. Especially, with operating frequencies having increased dramatically from low hundreds of megaHertz to several gigaHertz in many consumer appliances, aspects of the test socketing solution have become even more critical. Although most signal connections are able to tolerate deterioration in the series resistance introduced as probe assemblies wear, grounding connections are far less tolerant of the introduction of series resistance, since ground currents can cause crosstalk between signal connections as well as signal distortion.

In general, existing IC device test tooling cost of ownership (CoO) remains high as their life cycle can typically reach 100,000-500,000 practically, depending on IC device testing environment, IC device connection layer quality, contamination and oxidation susceptibility, and other negatively influencing factors such as economic pressure for lower cost IC devices.

Contact probes of test tooling for testing IC devices are generally made from conductive metals and metallic alloys such as BeCu, brass and steel alloys. Depending on the specific applications, these contact probes can also be coated and/or plated with a suitable conductive material such as gold, iridium, nickel, palladium and cobalt.

However, during repetitive testing of the IC devices, e.g., after 100,000 test cycles, these contact probes of the test tooling will have been impacted continually by repeated connection to and disconnection from the IC devices under test. As a result, the contact probes are often subjected to contact deterioration as a result of plated conductive layer peel-off, metal oxidation, foreign material adhesion, leading to substantive contact capability degradation. Although signal connections can be tolerant of the introduction of resistance into the circuit when small currents are involved, regions of high current flow such as shared ground connections represent a serious problem. To avoid ground loops, a term of art that describes spurious application of signal voltages resulting from currents flowing elsewhere in a device, it is important that inadvertent addition of resistance not occur in a shared ground connection since this will result in a changed input signal.

Furthermore, after repeated continual testing of IC devices described above, the penetration capability of the test tooling contact probes are also affected by the substantial loss of inherent compliant force generated by spring or elastic elements housed by the corresponding contact probe body or column. This problem is exacerbated by IC devices' reduced contact pitch sizes, e.g., from 1.27 mm to 0.2 mm or less.

It is therefore apparent that an urgent need exists for improved reliability for grounding contact probes of IC test tooling after repeated testing. This improved contact probes enables reliable testing of the ever shrinking IC devices for extended periods without any unnecessary downtime of IC test tooling associated with failure or substantial degradation of contact probes.

SUMMARY

To achieve the foregoing and in accordance with the present invention, systems and methods for reliable testing of packaged high speed integrated circuit (IC) devices is provided.

In one embodiment, a test probe assembly is configured for testing packaged integrated circuit (IC) devices. The test probe assembly includes a plurality of probes (pins), a termination pad interposer that allows the test probes or pins to be connected at one side to the testing equipment as well as a docking component that assures repeatable alignment of the device under test. The plurality of probes is configured to repeatedly maintain reliable electrical contact with a corresponding plurality of contacts on the Device Under Test (DUT) when under a compliant force. An interposing pad provides mechanical and electrical coupling for the plurality of probes and further provides a point of termination for cabling from the various test equipment used to transmit and receive signals from the DUT.

In some embodiments, the test probe assembly incudes an upper block, a main block and a lower block for housing the plurality of probes. The main block includes a plurality of main slanted probe cavities oriented at a first acute angle to a vertical axis of the test probe assembly, while the upper block includes a plurality of upper slanted probe cavities oriented at a second acute angle to the vertical axis. The first acute angle and the second acute angle are offset relative to each other by a small delta angle.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which:

FIG. 3B shows a sectional view of a correct grounding strategy at elevated frequencies;

FIG. 4 illustrates a basic plan of a single, symmetric, depressible contact pin assembly representative of the type used in making the test jigs described;

DETAILED DESCRIPTION

Figure 1A:
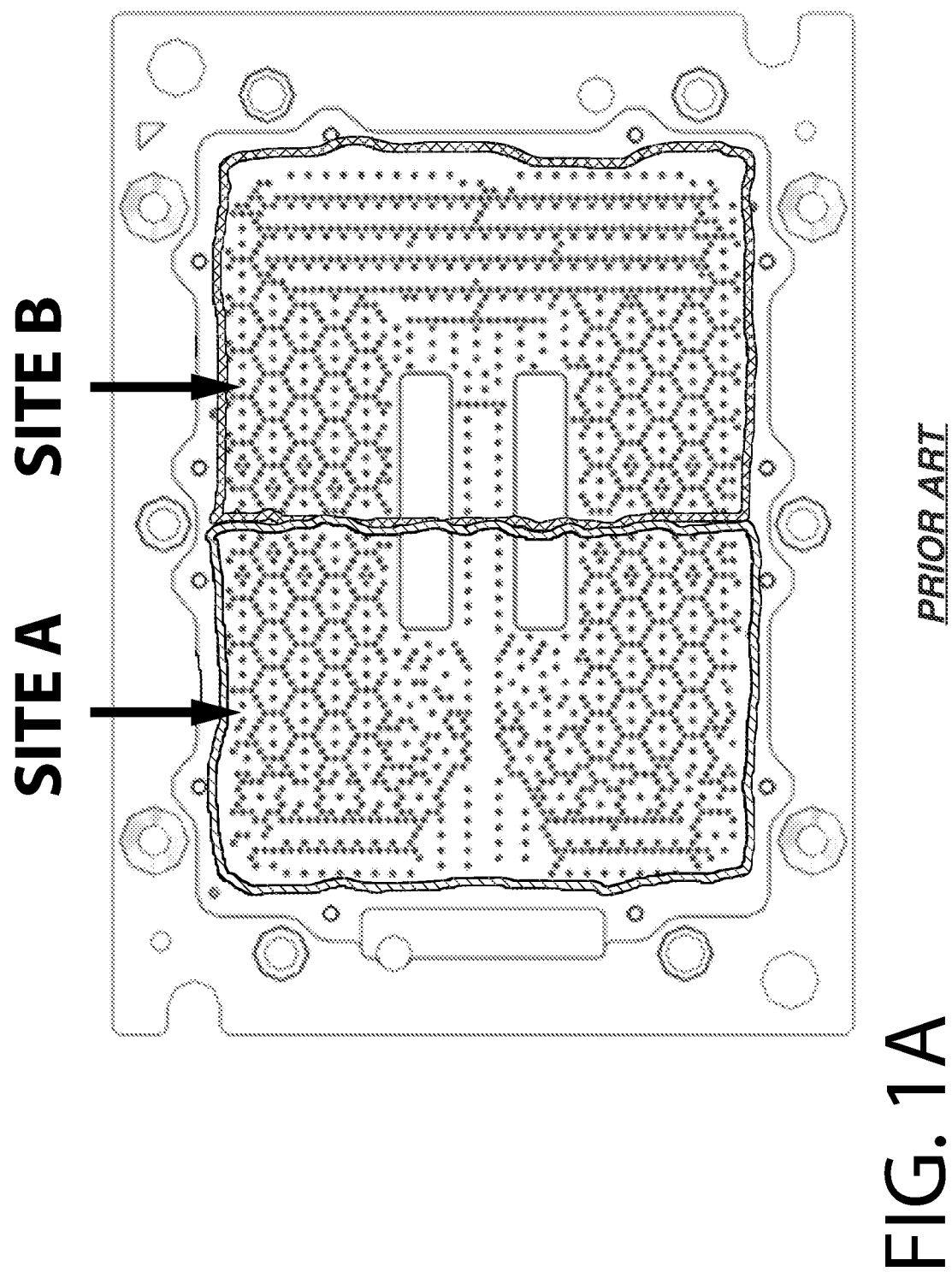
FIG. 1A is a plan view illustrating a typical high density test jig, greatly enlarged for easier viewing.

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The present invention relates to systems and methods for improved contact probes of reliable test tooling for packaged Integrated Circuits (IC) devices. Probes of the types described in this document normally allow a complex suite of test equipment that often comprises power supplies, signal sources or generators, data gathering equipment and analysis equipment to be connected to integrated circuits having a large number of connections. The test equipment may be hard-wired to any test probe assemblies but modern implementations of testers routinely terminate the equipment on a termination plate or board, an interposing pad, which is then attached to the assembly that contains the probes. In this way one end of the pins that make up the probe assembly is coupled to the termination board leaving the other end ready for connecting to the devices under test. An important aspect to be borne in mind is that automated test equipment is intended to test a very large number of devices and so repetitive connection and disconnection is a foundation design consideration.

Repeated connection and disconnection entails wear on the pin assemblies in the probing station with which they are associated and a consequence of this wear is to create variability in the quality of the connections to the DUT. Deterioration is problematic since the resulting improper rejection of a part being tested has serious cost implications, especially with modern, high density technologies. Densities of connection are remarkable in that we routinely find interconnection pitches from around 0.020" or about 0.8 millimeter or less, down to 0.5 millimeter. The actual pin layout and distribution of the pin density is of course dictated by the individual component part to be tested. By constructing the termination board for the test equipment separately from the probe assembly containing the contact pins it becomes feasible to change the probe assembly efficiently either when the pins begin to wear or on a planned maintenance schedule and thus avoid unplanned lost production in the testing equipment; noting that the connection between the probe assembly and the interposing pad is only changed when a new probe assembly is positioned as a replacement for the old worn part. As mentioned, the goal of this invention is to provide a mechanism for improving the performance of the assembly that comprises the contact pins and their mounting jig as well as prolonging the performance of the pins themselves.

To facilitate discussion, FIG. 1A is a plan view of the layout of pins (probes) for exemplary high density parts for test, and is useful for illustrating actual test results shown in FIGS. 8 & 9. It should be noted that the left and right side labelled "SITE A" and "SITE B", respectively, house the pin (probe) arrangement, including reference standard pins and/or test pins, of the various embodiments, in accordance with this invention. Note that a typical pin separation in the exemplary test jig is generally between 0.5 and 0.8 millimeter in this simple depiction of a typical segment of the jig.

Figure 1B:
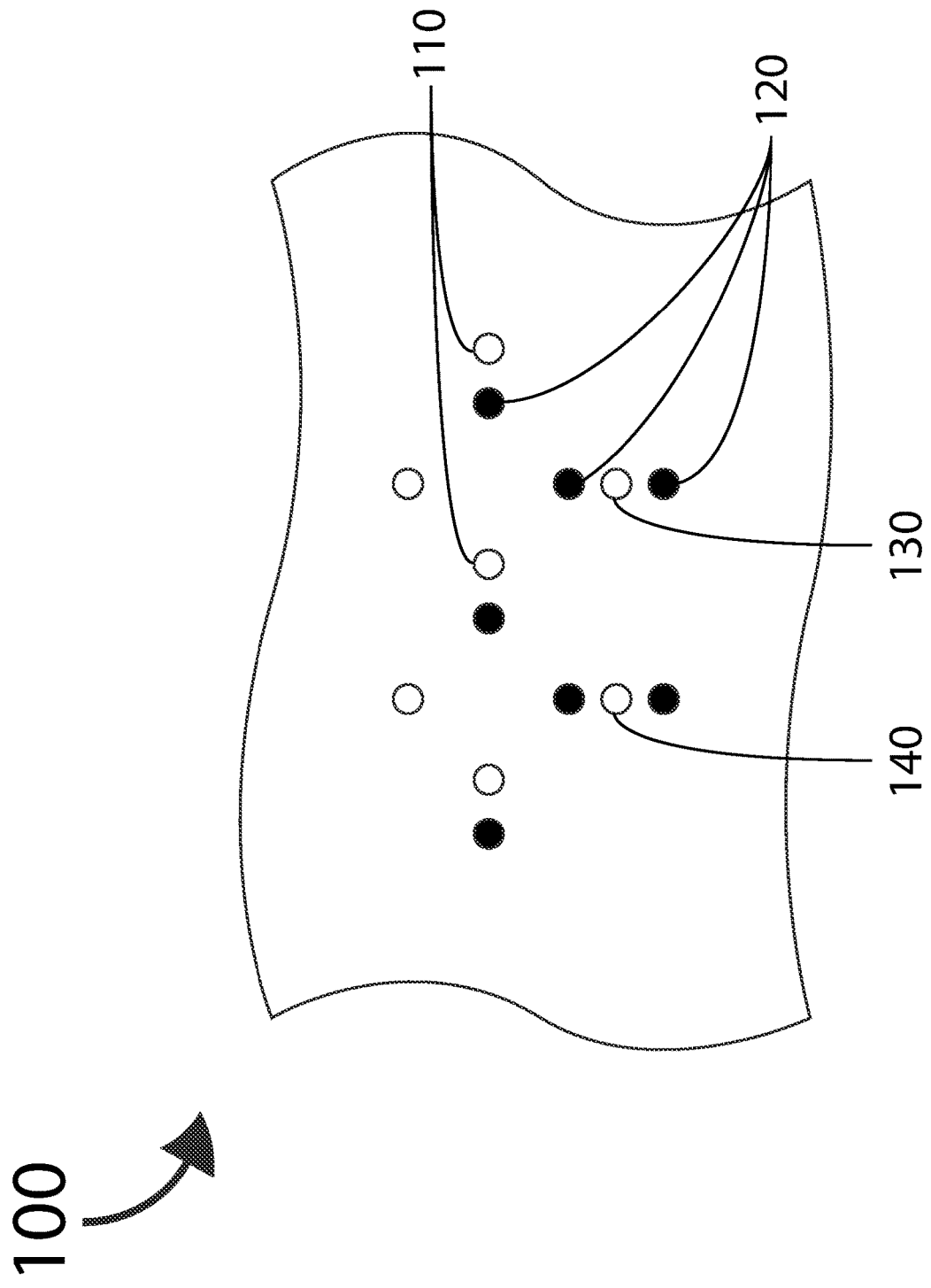
FIG. 1B shows a representative view of a small segment of a typical test probe set seen in FIG. 1B.

FIG. 1B is a plan view illustrating a small part of an IC test jig, which has a high pin density. Here, the bulk or body 100 of the test jig is typically manufactured by machining a piece of aluminum to align its upper and lower surfaces and to make holes that will allow the connection pins or probes to be inserted. Although the same physical probe or pin assemblies can be used in any hole position, in a given application the functions can be divided into one of three types; power connections such as voltages, ground connections and signal input or output connections. As shown in FIG. 1B, signal inputs 110 are shown alongside a neighboring ground connection 120 and power input 130 is also adjacent to a ground or return connection 120 as is a signal output 140 of the DUT.

In simple systems it is not uncommon to find only a single power connection and a single shared ground connection. However, in systems and circuits where input circuits are very sensitive and output circuits draw a significant amount of power, the interaction between them can be a matter for great concern. This problem is usually addressed by making sure that input circuits are suitable isolated from output circuits. In fact the difficulty can be so severe that a manufacturer will often publish guidance by way of a suggested printed wiring layout that is to be followed to ensure correct operation. The two usual concerns are the sharing of current paths between high and low current parts of the device in use and the high speed transmission lines which must be properly designed and routed to minimize the effects of signal reflections. The same caution of careful choice of current paths also applies to devices which have both analog and digital circuits present. In this invention we are particularly concerned with common mode problems that arise as a result of inadequate grounding when routing current paths.

Consider, by way of simple example, two sources of feedback that most will be familiar with in the case of an audio system. "Howl around" which is typically perceived as a loud squeal is normally caused by the acoustic signal from the loudspeakers being received and then re-amplified by the microphone circuit. The acoustic characteristics of the auditorium and frequency responses of the amplification system will determine the nature of this. This is typically countered simply by reducing the gain of the amplifier or attenuating some of the acoustic reflections by hanging absorbent drapes in the auditorium. However, the second common and annoying problem is the residual hum in a system that is caused by the microphone circuit detecting voltage variations not from the microphone but from the ground connection where other currents are being drawn in addition to microphone current, a "ground loop." In general, the wiring layout is often to blame and this must then be changed to reduce or eliminate this "hum." A supplementary effect of a ground loop is distortion of the applied signal so that the output sounds rough or unpleasant.

Figure 2A:
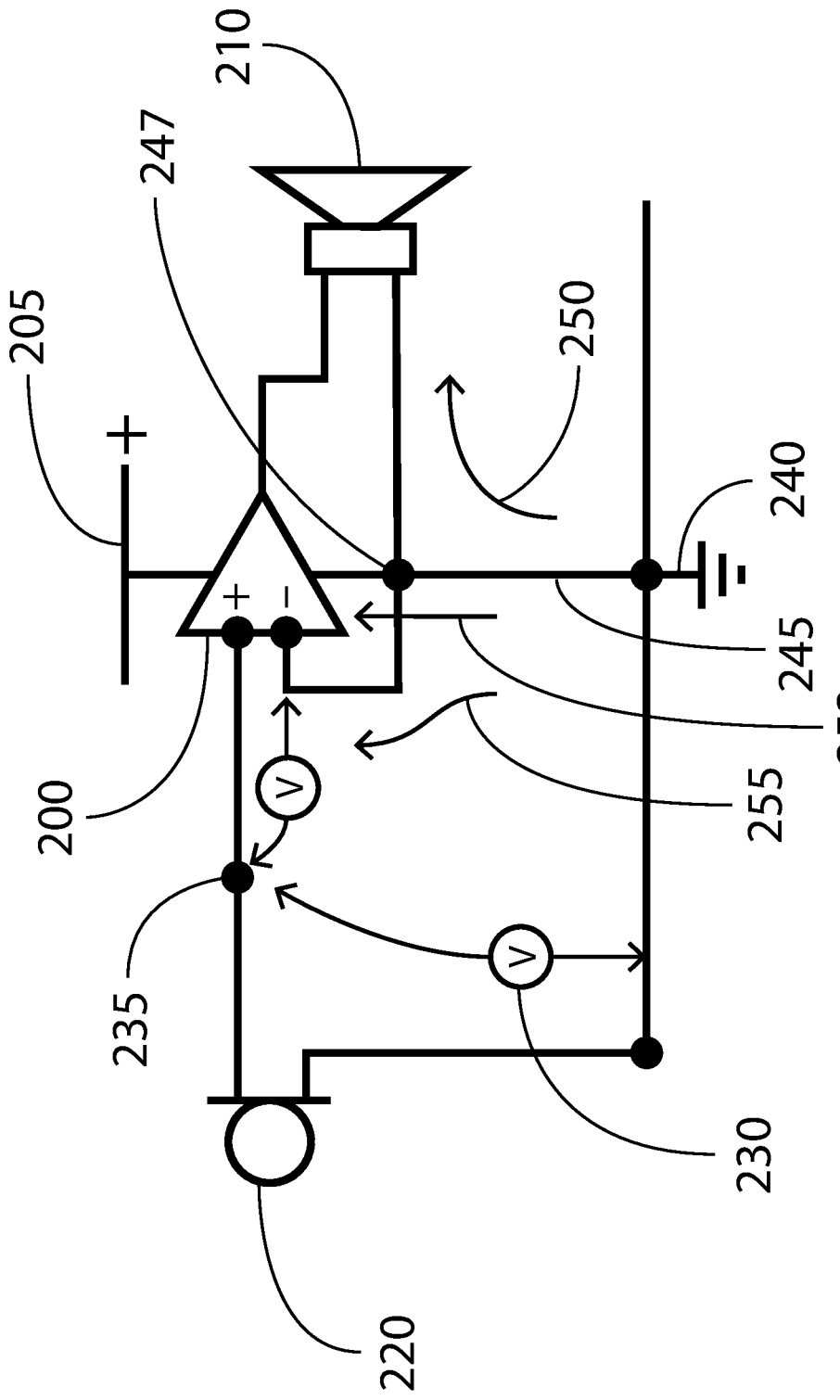
FIG. 2A shows a schematic of a simple circuit to aid in understanding grounding problems.

Turning now, by way of explanation of the ground loop problem, to the circuit of FIG. 2A where a simple audio amplifier is shown. In this example, an amplifier 200 is shown connected to its power supply 205 and its ground return 240 via conductor 245; it is usual for the ground return to be the connection point for the negative of the power supply in a single-ended system. The output drives a loudspeaker 210 connected to ground as well, through conductor 245 and the microphone 220 is connected between the input and ground, also via conductor 245. So the current flowing in conductor 245 is comprised of the amplifier current 253 that is drawn to run the device, along with the current 250 that may be drawn by the loudspeaker circuit and the current 255 created by the microphone. The voltage measured at the point 247 that is used to reference the microphone input is not the same as the actual ground 240 because the conductor 245 resistance "R" is not zero; this voltage is in fact the applied microphone signal minus the voltage that is the resistance of the conductor multiplied by the sum of the three currents, 250, 253 and 255, flowing in it and will be a varying voltage because of the change in amplifier consumption at various times as it amplifies the audio signals. So the amplifier input voltage 235 will differ from the applied microphone voltage 230.

Because the current drawn by the amplifier and the current drawn at the loudspeaker vary according to the signal being produced by the microphone, and the microphone signal is being changed by the resulting variation at point 247, the system will amplify the combination of these two signals. This means that the version of the signal delivered to the loudspeaker will be a distorted version of the intended signal from the microphone. The fact that this occurs in the ground part of the system leads to the terminology "ground loop," although it may not strictly be a loop. The important aspect is that shared ground connections can lead to significant noise or interference which then alters the system response. The solution to the problem is to make sure that only microphone signals are perceived by the amplifier and not the combination of signals caused by sharing current paths.

Figure 2B:
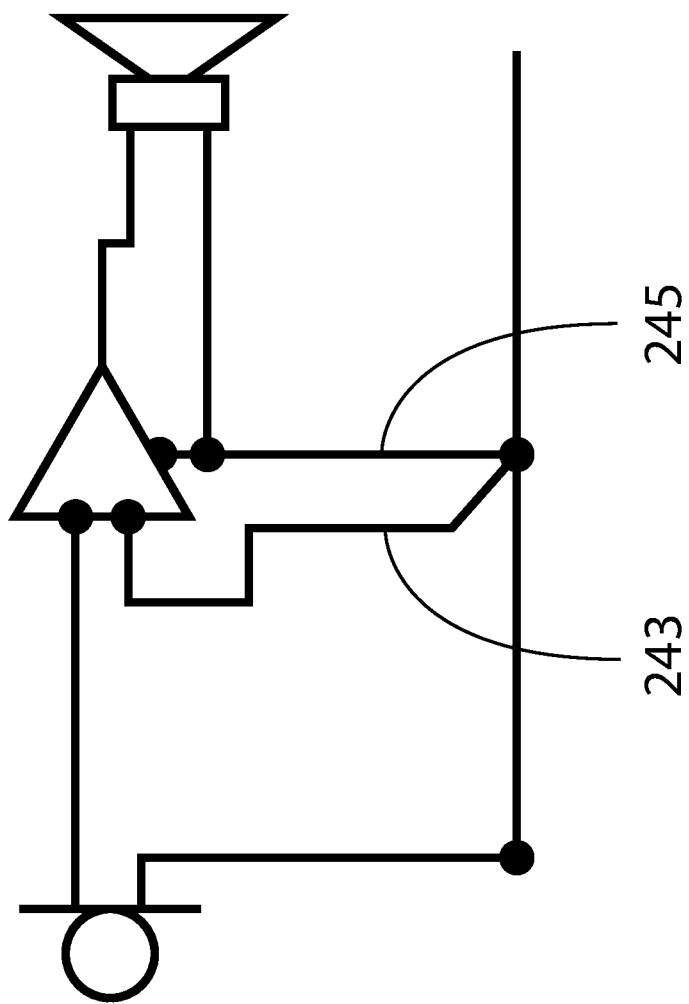
FIG. 2B illustrates a representative solution to the problem elaborated in FIG. 2A.

FIG. 2B illustrates the microphone return to ground 243 for the amplifier now separated from the power and loudspeaker ground returns 245. In this case the reference for the microphone signal is at the ground potential at 240 and no longer dependent upon the current flow in 245. This illustrates the preference for having ground connections in a test jig be independent and not reliant on shared paths that can induce unwanted distortion into the signal paths. Characteristically, these categories of distortion in a digital device are often seen as timing jitter where distortion of an applied signal pulse causes the DUT to appear to malfunction because a signal level was not achieved within the requisite time specification.

Returning to the DUT being tested in the system, where signals are relatively high level, such as logic systems where a logical zero (0) is below about a third of the supply voltage ($V_{cc}$ or $V_{dd}$ in the usual style of specification sheets) to the part and a logical one (1) is a voltage above two thirds of the supply voltage, noise levels are usually not greatly concerning. However, in systems where the supply voltages are quite low (in the neighborhood of 1.1 to 1.8 volts by way of example) and currents may be sufficient to offset the voltage reference point at a connecting pin in the test jig, the resulting noise may introduce an uncertainty in the logic level presented to the part. This is analogous to the problems of "hum" in an audio amplifier system as described above. Knowing that a frequent source of interference is the improper grounding of the system where current is allowed to flow along a path which is used as a reference connection for a sensitive input a careful solution is demanded. A further, though less common concern, is improper grounding of an electrostatic shield (the braid of a shielded cable, for example) which permits radiated noise from nearby emitters to appear on the input line and be rectified in some fashion so as to offset the reference voltage for the input amplification stages.

In a high frequency probe system such as found in modern high speed integrated circuits, the simple solutions are generally less clear. Because of the very short wavelengths at the test frequencies, good quality grounds are essential to prevent interference resulting from the physical distances between current paths being substantial fractions of a wavelength of the applied signals. This then requires ground connections that are close to the signal connection and not dependent on other notionally grounded points in the test jig; note here that even though a direct current test may show the various ground points to be at the same potential, this rarely holds true at the frequencies of operation. Indeed at radio frequencies it is simple to provide a structure which appears to be open circuit at the operating frequency whilst being at ground potential for the purposes of the power supply current.

To minimize noise that results from current flow in ground paths, or returns, for the device under test, because the distances between ground points can be significant fractions or even multiples of a wavelength at the higher test frequencies experienced with the continuing advance of device technologies, it is important to make sure that ground paths are kept as short as is possible. An example of path length minimization is seen in most high frequency, printed-circuit designs where multiple vias (conductive plated holes that connect to the ground plane that covers most of one side of a circuit board) are located proximate to the signal path conductors thus reducing the distance that ground currents have to travel.

Figure 3A:
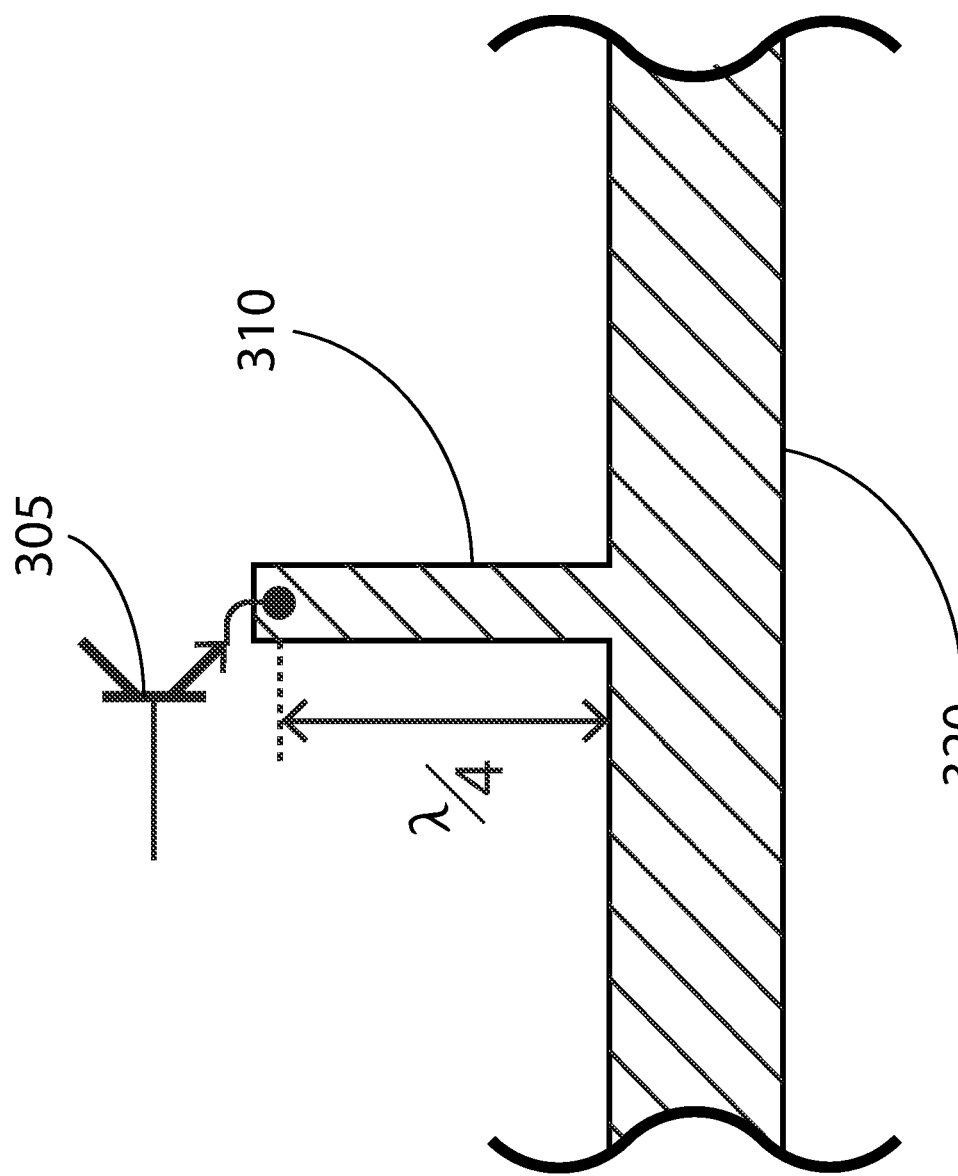
FIG. 3A shows an exemplary top view of inadequate grounding at high frequencies.

Consider FIG. 3A, the case where the actual ground point is set a quarter wavelength away from the intended ground. The emitter of transistor 305 is connected to a direct current ground 320 through a conductive element 310 that is a quarter wavelength long at some frequency. In this case, at that frequency, the transistor will not see a ground but an open circuit, even though current from the actual ground is still able to reach the transistor to allow it to be biased for operation. A typical effect is that the circuit may exhibit a tendency to oscillate uncontrollably but, of course, there are also examples where this effect can be used to advantage such as making the distance a half-wavelength at a particular frequency so that an effective ground is only available at that particular frequency; this is a way that a filter can be created. This category of problem, being the uncertain location of an actual ground point, is a primary reason for using double sided circuit boards where the connection layer lies on one side of the circuit board and the other side is almost entirely a conductive layer representing the actual signal ground. Depending upon the actual circuit, the ground may be continuous only in certain regions of the board and parts may be connected on this notionally ground side of the board; in complex arrangements, power supply and ground connections may be buried in a sandwich arrangement and only component connections made accessible on either physical side of the board.

Moving now to FIG. 3B a section view is shown of the illustration of FIG. 3A, where a conductive layer 325 may be added below the substrate layer 340 and in addition to the detail of FIG. 3A, element 310, conductive links 315 are provided connected to the ground layer 325 so that the ground appears more correctly at the connection point at the end of element 310 and is no longer displaced by a frequency dependent element. The line at 322 represents the upper edge of the grounding strip 320 where the element 310 connects in FIG. 3A. This understanding may now be used to formulate a solution to grounding problems that arise when a test jig is developed for critical applications such as the testing of a high speed, low voltage integrated circuit.

When a test jig is required that must pass high frequency signals alone to the device under test (DUT) it is not uncommon for the test fixture to allow for relatively simple grounding connections using only a small number of the pins. Because, some test applications require that both signal and ground connectivity be provided to the DUT to maintain not just signal fidelity, but to provide the isolation from other signals that are being delivered to and from the DUT and to maintain an impedance match to reduce signal distortion due to unintended reflections of the signals, provision must be made for a high density of pins so that well-conditioned grounding is possible.

FIG. 4 illustrates a typical test pin comprised of four parts. Two test pins 410a & 410b are set within a conductive enclosure 480 and a compression spring 420 is used to keep the pins apart. Because the pins make repeated contact with parts under test, they are fabricated from hard wearing materials and can be plated with a suitable material such as gold or palladium or similar so as to ensure good conductivity. Although the pins may be the same at both ends in some implementations, this may not be always the case. These parts are precision parts and generally rely on conduction through the spring as well as that along the outer shell 480. The wearing surfaces can be treated so as to prolong the life of these contact pins but as will be explained, careful design of the test jig can affect this beneficially. In certain applications, the outside surface of the shell 480 can be passivated so as to insulate the shell electrically from the block that is used to position the pin and its several neighbors as part of the assembled jig. A material that is resistant to corrosion without requiring a separate treatment can be chosen if conductivity between the outer surface and the block is required.

Figure 5A:
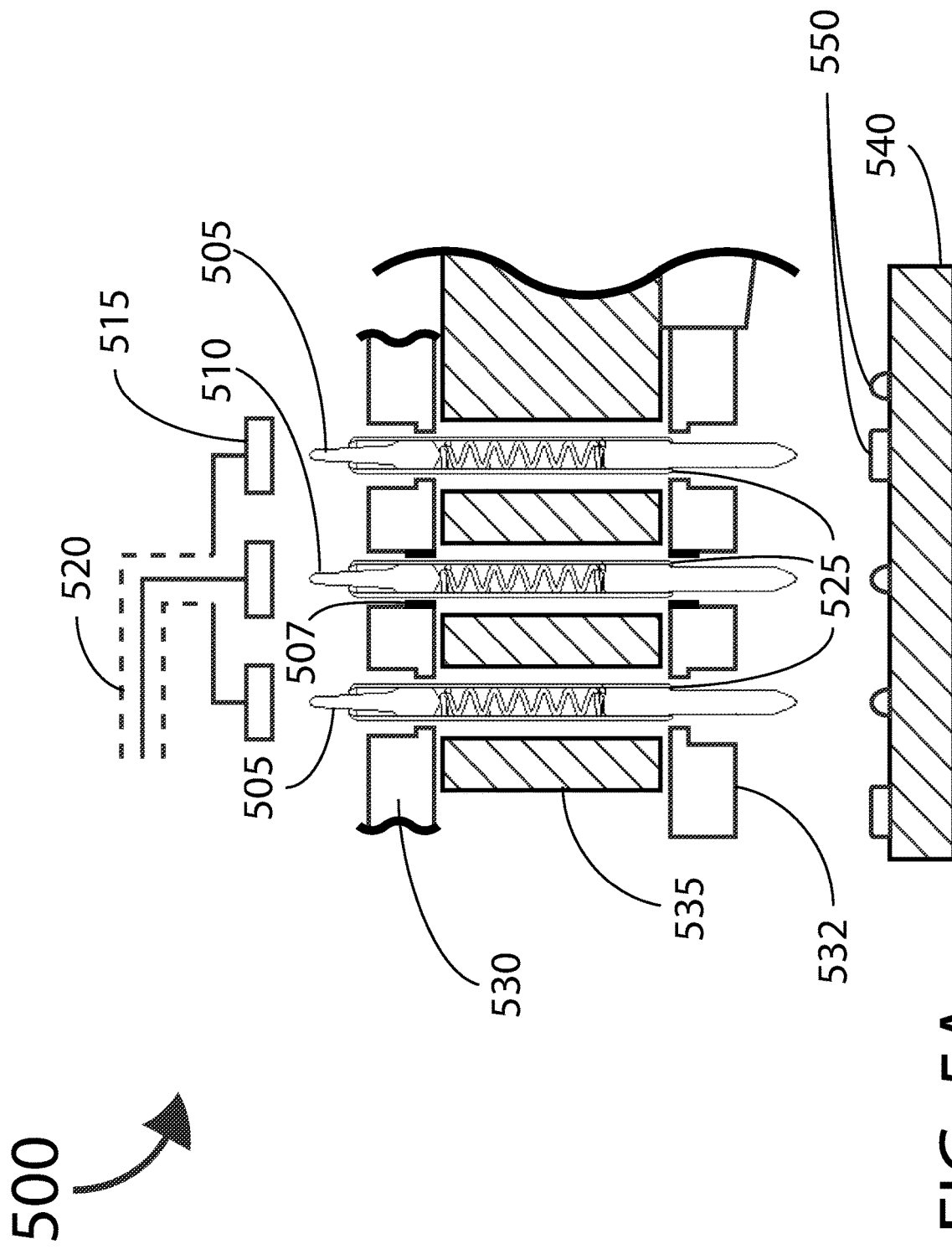
FIG. 5A shows a sectional view of some of the elements in a testing system.

FIG. 5A shows a sectioned view of a portion of a typical test jig that maintains both signal and return or ground connectivity all the way to the DUT itself, rather than simply ending at the equipment side of the pin interface and trusting the pin structure to have minimal influence. It will be appreciated that, especially in systems where very small signals are considered, that the series resistance presented by the pins can be a critical aspect of the test and that it is essential that this be consistent and, ideally, minimized. Because ground paths are often shared current paths, the existence of a significant series resistance means that a correspondingly undesirable yet significant voltage drop may be created. An inconsistency in this resistance can lead to unpredictable or unreproducible test results which may in turn mischaracterize critical component parts during testing. Because some applications cannot be repaired after construction or assembly, accurate testing and characterization of devices is a key point in the manufacturing process to avoid waste.

By way of example, the signal is delivered to the test jig by exemplary coaxial cable 520 to pads 515 on a mating connection-board (not shown) or substrate upon which the pads are printed or mounted. This may be achieved using conventional printed circuit board techniques, selecting the substrate and pad materials to match the application. When this carrier or connection-board, upon which the cables that carry various test voltages and signals are terminated so that they may be applied to the DUT, is placed in contact with the test jig assembly, the pins at 505 and 510 are compressed and maintained in contact with the pads, usually by spring pressure.

An illustration of the individual pin assemblies is shown at FIG. 4 for reference. The DUT 540 is positioned on the opposite side of the jig from the connection-board that supports the connection pads 515 so that the related pins may make contact with connection points 550 on the DUT, which connection point arrangement sets the layout of the contact pins in the test jig as illustrated in FIG. 5A. In this partial illustration, the body 525 of the contact pin assembly is predominantly housed in the main locating block 535. The holes in the main locating block into which the pin assemblies are inserted can be anodized, plated or chemically treated so as to form a very durable, insulating or connection layer between the pin housing and this block.

This main locating block is essentially at supply ground potential in most cases which may also be the same as the signal ground, but as frequencies increase, this latter may not be true so provision must be made to guarantee the quality of the signal ground. In one implementation, the mounting block is held at an elevated potential relative to a safety ground and provision is made to couple this to signal ground at the frequencies of interest using capacitive or resonant coupling structures. The clearance distance between the pin housing and the block can be chosen according to the design requirements. It may form a low impedance path at signal frequency by virtue of the anodizing layer being only a few microns thick, or else there may be a substantial air gap so that the pin housing forms the center conductor of a coaxial structure. The housing may be treated so as to form a good conductive path between the pin housing and the block.

By way of the example illustrated in FIG. 5A, the center pin 510 is the signal pin and the two pins 505 either side are ground connections for the DUT that may be more than signal grounds in preference for relying entirely upon the outer conductor of the coaxial feed 520. It is generally preferred if the fit of this outer pair of pins is snug (an easy push fit) whereas the fit of the signal pin may be looser, depending on the design requirements for what is now a section of transmission line. The snugness of fit can be achieved in more than one way. The upper retaining block 530 secures the shell of the contact pin assembly and in concert with a matching lower retaining block 532 will maintain a good contact to the grounding pin enclosure. An insulating washer 507 captures the signal pin at either end and ensures that it is insulated from the ground connections.

Figure 5B:
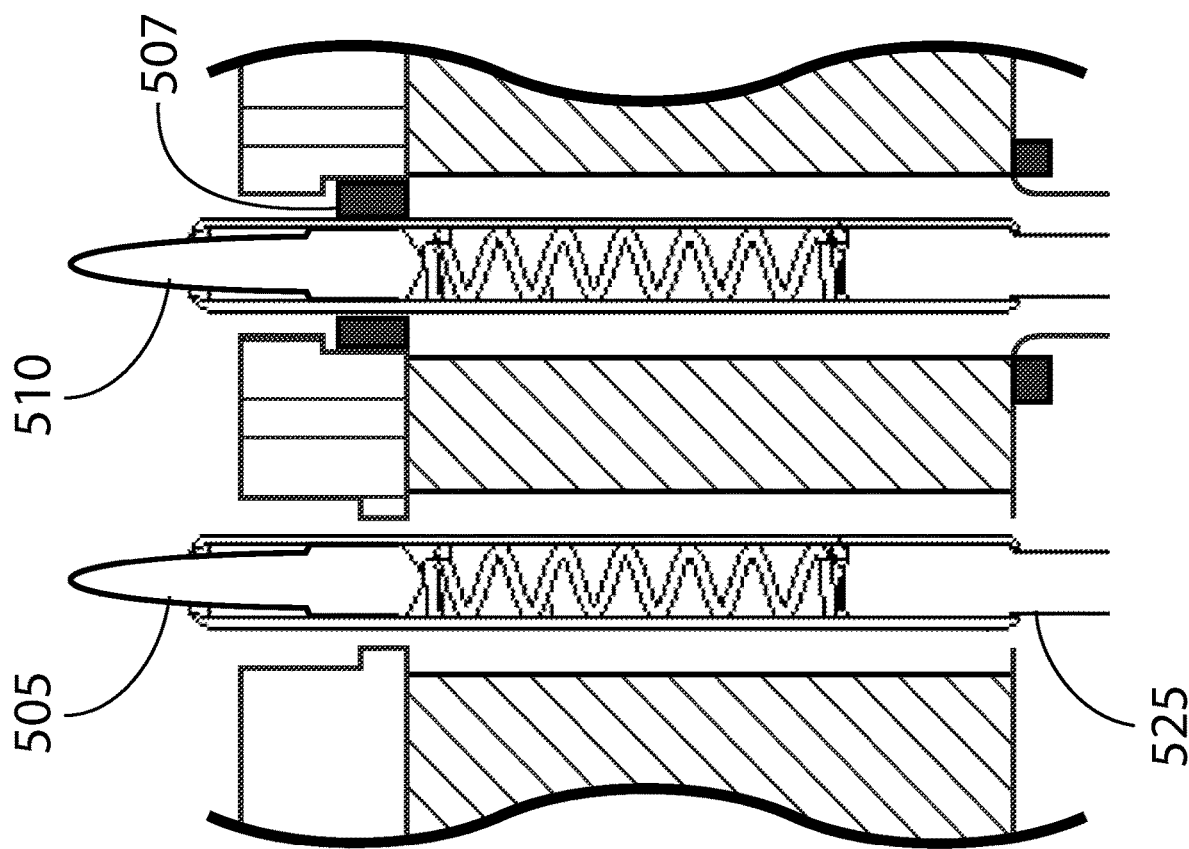
FIG. 5B is a detail view of that part illustration of FIG. 5A.
Figure 7:
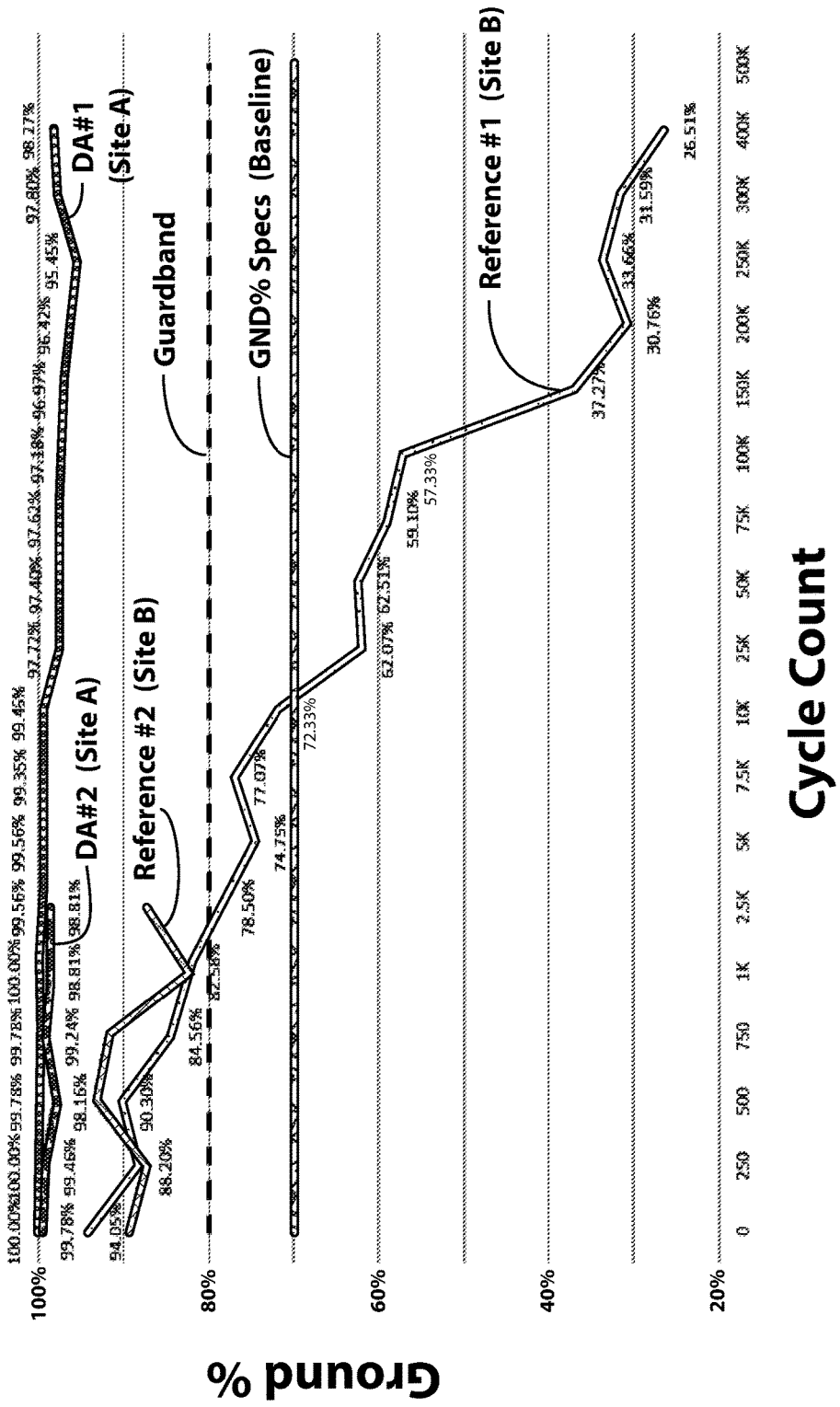
FIG. 7 is a graph illustrating the advantages of the embodiment depicted by FIG. 6.

FIG. 5B clarifies this. Grounding quality very quickly becomes a concern as repeated connection and disconnection causes wear on the pins as they move in the jig. The consequence of this is that the resistance of the grounding pins 505 becomes uncertain, generally increasing with wear. This is illustrated in FIG. 7. The similar effect on the signal connecting pin 510 is normally less of a concern since it is usually connected to a point on the DUT of greater impedance and so the effect is smaller. In one implementation, the working specification demands that any ground connection shall not exceed 100Ω and so the test jig implementation requires that steps be taken to compensate for wear. Insulating washer 507 is easier discerned in this figure.

Figure 6:
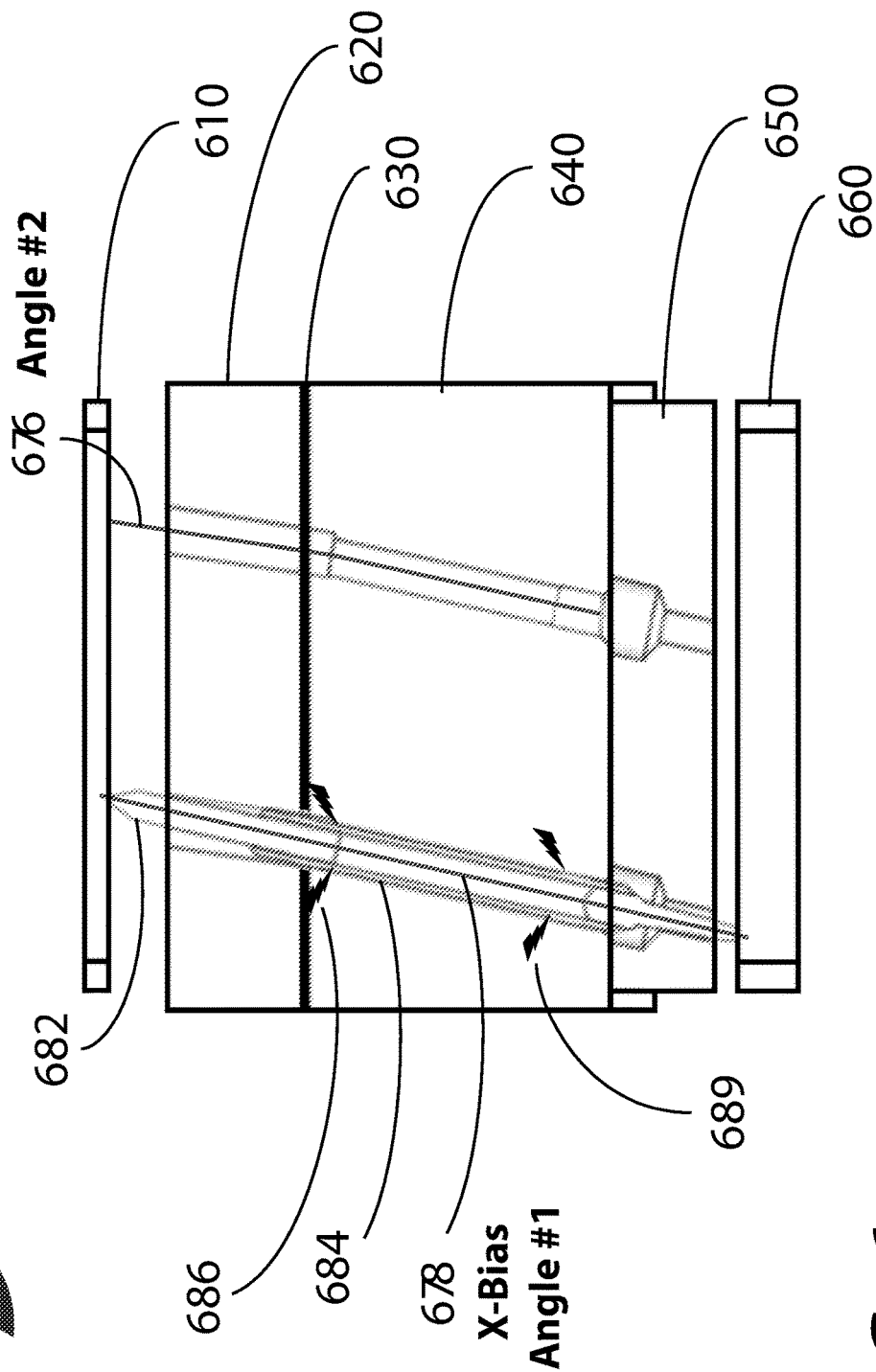
FIG. 6 illustrates an improved performance layout for one embodiment of an exemplary test jig in accordance with the present invention.

FIG. 6 shows a sectional view of an exemplary Dual-Angle ("DA") test jig 600 when in the loaded, operating position, in accordance with one embodiment of the present invention. Here the termination board to which the signal and power cables are attached is a printed circuit board assembly 660 which is at the lower part of the assembly. Not shown are the contact pads that align to the contact pins 682 and their connections to the external test equipment that drive the device for testing. The lower block or retaining layer 650 can be of any suitable material and in general is a composite or plastic material bored to receive the pin assembles as they are placed into the jig's main block 640. The upper block has at least one probe cavity with a bore axis 676 that is made at an angle that is rotationally offset from the cross-bias axis 678. The effect of this is to cause the outer enclosure of the pin assembly to bind quite tightly once assembled. This offset angle being the difference between the longitudinal axis of the bore in the main block 640 and that in the upper block 620 is approximately between 2° and 5°; for example 2.9°.

Typically the laminating layer 630 that will secure the upper retaining layer 620 is adhered to the main block and the pin assemblies simply pushed through. This laminating layer 630 can be punched to create holes prior to pin assembly insertion or can be simply pierced to ease the pin insertion task. The DUT 610 is positioned so as to be aligned with the contact locations of the jig. Because of the spring that separates the two pins and preloads them against the enclosure of the pin assembly shown in FIG. 4, there may be slight contact at the sides of the pins in this unloaded condition, but as the pins are loaded by positioning the test jig against the termination board 660, the side force due to the angular positioning of the pins causes a movement towards and contacting the walls of the enclosure, and establishing the initial contact region 689. Similarly, when the DUT 610 is pushed against the opposite pin in the pin assemblies, this actuation causes further displacement against the enclosure wall thereby creating an additional contact region 686, and also provides inherent support for the top during actuation.

The resulting arrangement effectively removes any electrical effect from the spring within the pin assembly. In some embodiments, instead of a positional offset between the upper block 620 and the main block 640, an angular offset as shown in FIG. 6 is chosen instead. When properly toleranced, this produces the same locking effect on the pin assembly and eases construction. It is worth noting that the pin assemblies need not rely upon the main block 640 for any electrical connection and the receiving bores that house the pin assemblies are preferably passivated; this may be an anodizing process for insulation or may be an alodining treatment if a soft conductive layer is preferred. The pin assemblies may also have their enclosing shell passivated, which may help if high voltages are present.

Turning now to FIG. 7, extensive experimental laboratory testing has been undertaken to verify properties of the Dual Angle embodiment of FIG. 6 and document its advantageous performance. Using the test jig shown illustrated in FIG. 1A, a system was developed to test the grounding performance of the implementations of this invention. The figure shows the effectiveness of the grounding normalized at the best level achieved in either implementation. Thus the 100% performance is defined as that achieved by the Dual Angle set-up of the pins in the test jig, designated Site A. This DA pin set-up uses the angular offset between the bore in the main block of FIG. 7, being the cross-bias angle #1 678 and the bore in the upper block 620, being Angle #2 676. Here the angular change in the centerline of the implementation causes the pin housing to be mechanically constrained against the respective sides of the bores. The horizontal scale shows the number of connect-disconnect cycles applied to the test jig and it can be seen that at ten thousand cycles the grounding performance has declined by approximately 0.5% but as the test continues, a slightly accelerated rate of wear has started to occur.

Real world testing has revealed that the acceptable limit, on a particular set of tests on actual devices which spawned this urgent need for exceptional management of the grounding performance, is generally set at 70%. Below this the false rejection rate is wholly unacceptable. From a maintenance point of view, using a guard band indication set at 80% grounding performance to guarantee the accuracy of testing on the devices, it is plain to see that the DA set-up provides certainty that the test is reliable. Actual verification results at the date of this submission show that the performance remains acceptable well past 300,000 cycles.

By contrast, the traditional set-up of the jig at Site B, the Reference set-up, shows that not only does the testing start with the grounding performance already at a surprisingly lower level, being almost 6% worse than the DA set-up, but the performance decline with use is rapid. After only 5,000 cycles the traditional set-up has already intruded into the guard space which is normally used as an alert that maintenance is soon to be performed. At 10,000 cycles the performance deterioration places the traditional set-up at the cusp of failure where soon after there will be an unacceptable false rejection rate for the devices. At this point a device maker is faced with an unavoidable maintenance demand.

Remedial dismantling of the test jig removed from service followed by a period of ultrasonic cleaning of the stripped Base Block and then reassembly, shows that a partial restoration of grounding performance does occur but only to a level that is slightly above the guard-band level and that this may only extend the lifetime of the test jig by less than another 10,000 cycles. The root cause is not clear, beyond it being some contamination of the jig, but it is greatly reduced by using the DA set-up, which has required no mid-life restorative treatment.

While this invention has been described in terms of several embodiments, there are alterations, modifications, permutations, and substitute equivalents, which fall within the scope of this invention. For example, many modifications are possible and the above described features from the various embodiments can be useful alone or in combination. It is also contemplated that novel feature(s) of the above described systems and methods can be useful for non-grounding pin structures. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A test probe assembly useful for testing a packaged integrated circuit (IC) device under test (DUT), the test probe assembly comprising:
   a main block having a plurality of main slanted probe cavities oriented at a first acute angle to a vertical axis of the test probe assembly;
   an upper block having a plurality of upper slanted probe cavities oriented at a second acute angle to the vertical axis, and wherein the first acute angle and the second acute angle are offset relative to each other by a small delta angle;
   a plurality of slanted compressible probes configured to repeatedly maintain reliable electrical contact with a corresponding plurality of DUT contacts when under a compliant force, each of the probes having a probe barrel which is contained within its probe retention cavity and oppositely extending probe tips, the oppositely extending probe tips of each of the probes being depressible in the probe barrel;
   a lower block having a plurality of slanted cylindrical channels oriented at a third acute angle to a vertical axis; and
   a PCB having a corresponding plurality of pads configured to support the plurality of probes.

2. The test probe assembly of claim 1 wherein as each of the probes is loaded by positioning the test probe assembly against a termination board, a side force due to angular positioning of each of the probes causes a movement of the probe barrel towards and establishing an initial contact with a lower region of a corresponding main slanted probe cavity, and wherein as each of the probes is further loaded by positioning the test probe assembly against the DUT by pushing against an upper probe tip, the probe barrel is further displaced towards and establishing an additional contact with an upper region of the corresponding main slanted probe cavity.

3. The test probe assembly of claim 1 further comprising a laminating layer between the main block and the upper block.

4. The test probe assembly of claim 1 wherein the plurality of compressible probes are spring probes.

5. The test probe assembly of claim 1 wherein the plurality of compressible probes are grounding probes.

6. A test probe assembly useful for testing a packaged integrated circuit (IC) device under test (DUT), the test probe assembly comprising:
   a main block having a plurality of main slanted probe cavities oriented at a first acute angle to a vertical axis of the test probe assembly;
   an upper block having a plurality of upper slanted probe cavities oriented at a second acute angle to the vertical axis, and wherein the first acute angle and the second acute angle are offset relative to each other by a small delta angle;
   a plurality of slanted compressible probes configured to repeatedly maintain reliable electrical contact with a corresponding plurality of DUT contacts when under a compliant force, each of the probes having a probe barrel which is contained within its probe retention cavity and oppositely extending probe tips, the oppositely extending probe tips of each of the probes being depressible in the probe barrel; and
   wherein the small delta angle is between 2° and 5°.

7. The test probe assembly of claim 6 wherein the small delta angle is 2.9°.

* * * * *